(12) United States Patent
Pailthorp et al.

(10) Patent No.: US 7,259,354 B2
(45) Date of Patent: Aug. 21, 2007

(54) METHODS FOR PROCESSING HOLES BY MOVING PRECISELY TIMED LASER PULSES IN CIRCULAR AND SPIRAL TRAJECTORIES

(75) Inventors: Robert M. Pailthorp, Portland, OR (US); Weisheng Lei, Portland, OR (US); Hisashi Matsumoto, Hillsboro, OR (US); Glenn Simenson, Portland, OR (US); David A. Watt, Beaverton, OR (US); Mark A. Unrath, Portland, OR (US); William J. Jordens, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

(21) Appl. No.: 10/912,525

(22) Filed: Aug. 4, 2004

(65) Prior Publication Data

US 2006/0027544 A1 Feb. 9, 2006

(51) Int. Cl.
*B23K 26/38* (2006.01)
(52) U.S. Cl. .............................. 219/121.72; 219/121.71
(58) Field of Classification Search ........... 219/121.61, 219/121.62, 121.71, 121.8, 121.7, 121.67, 219/121.72, 121.78
See application file for complete search history.

(56) References Cited

U.S. PATENT DOCUMENTS

| | | | | |
|---|---|---|---|---|
| 5,688,418 A | * | 11/1997 | Yoshiyasu et al. | 219/121.71 |
| 5,841,102 A | * | 11/1998 | Noddin | 219/121.71 |
| 5,856,649 A | * | 1/1999 | Yamazaki et al. | 219/121.67 |
| 5,910,261 A | * | 6/1999 | Mori et al. | 219/121.71 |
| 6,492,616 B1 | * | 12/2002 | Tanaka et al. | 219/121.71 |
| 6,706,998 B2 | | 3/2004 | Cutler | |
| 6,749,285 B2 | * | 6/2004 | Liu et al. | 219/121.71 |
| 6,781,092 B2 | * | 8/2004 | De Steur et al. | 219/121.71 |
| 2002/0040893 A1 | | 4/2002 | Arai et al. | 219/121.71 |
| 2004/0183855 A1 | * | 9/2004 | Cheng et al. | 219/121.71 |

FOREIGN PATENT DOCUMENTS

JP 2003-48088 A * 2/2003

OTHER PUBLICATIONS

"Applications Guide Model 53XX UV Series", Rev. 139706A, Dec. 2003, Electro Scientific Industries, Inc, Portland, Oregon, pp. title, copyright, iii-ix, and 97-143.

* cited by examiner

*Primary Examiner*—Geoffrey S. Evans
(74) *Attorney, Agent, or Firm*—Stoel Rives LLP

(57) ABSTRACT

High speed removal of material from a specimen employs a beam positioner for directing a laser beam axis along various circular and spiral laser tool patterns. A preferred method of material removal entails causing relative movement between the axis of the beam and the specimen, directing the beam axis at an entry segment acceleration and along an entry trajectory to an entry position within the specimen at which laser beam pulse emissions are initiated, moving the beam axis at a circular perimeter acceleration within the specimen to remove material along a circular segment of the specimen, and setting the entry segment acceleration to less than twice the circular perimeter acceleration.

27 Claims, 7 Drawing Sheets

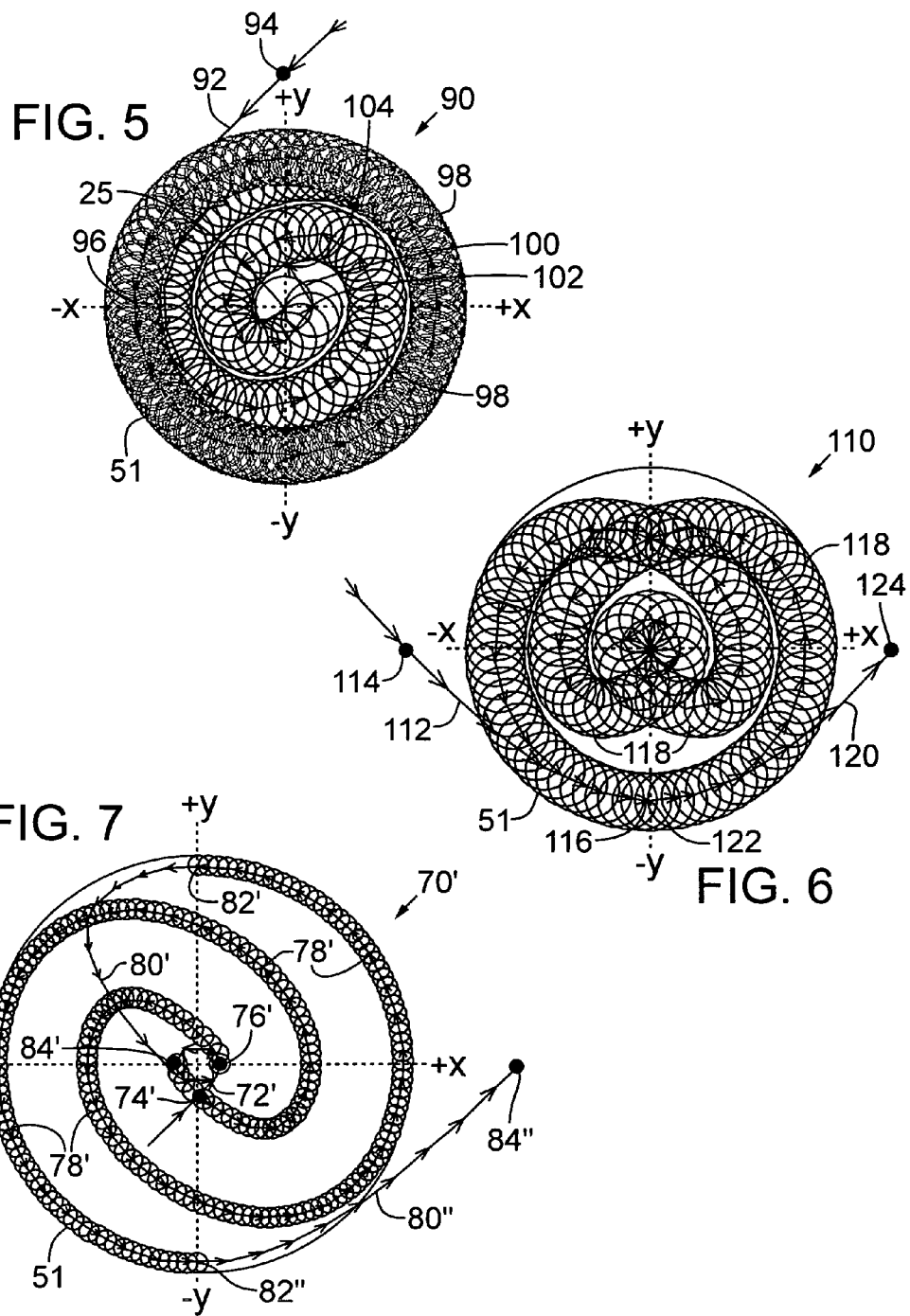

Note pulse from each repetition overlap almost perfectly. This is BAD.

Note that pulses are much more uniformly spread out. This is GOOD.

METHODS FOR PROCESSING HOLES BY MOVING PRECISELY TIMED LASER PULSES IN CIRCULAR AND SPIRAL TRAJECTORIES

COPYRIGHT NOTICE

© 2004 Electro Scientific Instruments, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR § 1.71(d).

TECHNICAL FIELD

The technical field relates to lasers and more particularly to methods for employing laser beams to rapidly process holes in various specimen materials.

BACKGROUND INFORMATION

Electronic circuitry continues to grow in complexity while simultaneously shrinking in size and cost. The resulting circuit density increase has placed large demands on production throughput of high-density integrated circuits, hybrid circuits, and ECBs.

Prior workers have employed ganged mechanical drills and punches to process holes in ECBs, but the diameters of the holes are larger than new hole diameter requirements dictate. Moreover, mechanical drilling methods have been slow, prone to tool breakage, and limited to drilling so-called "through" holes.

More recently, laser-based drilling methods have evolved that enable processing each second hundreds of very small holes (referred to as "microvias" or "vias") that often terminate on conductor layers within the ECBs.

For some drilling applications, a Gaussian distributed laser beam is used to process the material, and this beam has a diameter significantly smaller than the diameters of the holes being drilled. Therefore, the laser beam must be moved to either excise the hole or ablate its entire area. The types of motion and constraints on the motion directly impact the time taken to drill a hole, and hence the laser system throughput.

Prior workers have laser-drilled holes with so-called "trepan" and "spiral" motion patterns, which are commonly referred to as "tools." Trepan processing starts at the center of the hole, then moves rapidly to the hole perimeter and spins the beam for a programmed number of repetitions around the perimeter before returning rapidly to the center. Spiral processing starts at the center of the hole, moves rapidly to an inner diameter, then spins the beam positioner for a programmed number of revolutions, incrementing the diameter until the hole perimeter is reached. Laser beam movements may be carried out by a wide variety of laser beam positioning systems, such as the Model 53XX series of workpiece processing systems, manufactured by Electro Scientific Instruments, Inc., of Portland, Oreg., the assignee of this patent application.

Prior trepan and spiral laser hole drilling methods present at least the nine problems set forth below:

1. Prior tool patterns cause undue acceleration limits on positioner systems. Prior art trepanning entails moving the laser beam in a circular motion around the perimeter of the hole being processed. Skilled workers know that the radial acceleration of circular motion is equal to $v^2/R$, where $v$ is the tool velocity, and $R$ is the radius of the circular motion. After positioning the tool to the center of the hole, trepanning is preceded by an initial move segment that transitions in a smooth manner between the center of the hole and the start of circular motion to limit the tool acceleration and jerk (rate-of-change of acceleration). With prior art trepanning, the acceleration required by the initial move segment is $2v^2/R$, which is twice the acceleration required for the circular motion. Moreover, the motion axis requiring the double acceleration is the same axis executing a half-time duration acceleration pulse, resulting in a jerk profile four-times greater than circular motion requires. The laser beam positioning system acceleration is limited because twice the motor current is demanded at twice the servo frequency.

2. Prior spiral tool patterns are limited to outward spiraling, which limits the types of material that can be processed.

3. Prior trepan and spiral tools require time-wasting multiple steps for processing a hole with both spiral and repeated perimeter motions. Executing multiple steps requires the beam positioner to perform a generic move algorithm that requires at least two acceleration pulses to move the tool back to the center of the hole between steps.

4. If beam positioner settling time is required for recovering from a high acceleration, high velocity move from a prior hole, the settling time is implemented by a constant tool velocity move to the next hole target location, which limits the available beam positioner motion range. This motion range is significant when employing galvanometer-based beam positioners.

5. The above-described settling time technique also fails to settle the beam positioner at the steady state hole processing frequency, which causes a transient motion response when oscillatory circular motion begins.

6. Prior tool patterns are unduly slow when multiple repetitions of a spiral tool are required to approach the hole from various entry angles. Prior beam positioner methods employ the above-described generic move algorithm that requires at least two acceleration pulses to return to the center of the hole between repetitions.

7. Prior trepan tool patterns may cause uneven removal of material. This is so because the laser beam energy is concentrated in one quadrant of the hole as the beam moves from the center of the hole to the perimeter, and back again.

8. Prior spiral and trepan tools do not synchronize the timing of laser triggering signals with beam positioner motion, which causes an omission of a first hole processing pulse because typical Q-switched lasers do not generate a first pulse on command.

9. Prior trepan tool patterns used for drilling holes with multiple repetitions at the perimeter, substantially overlap laser pulses around the hole perimeter, and thereby cause uneven removal of material.

What is still needed, therefore, are lower cost, higher throughput workpiece processing machines having tool patterns that produce smaller, high-quality holes in a variety of workpiece materials, such as virtually any printed wiring board material, whether rigid or flexible, copper-clad or exposed, fiber reinforced, or homogeneous resin dielectric. The workpiece materials may also include ceramic substrates and silicon substrates, such as those employed in semiconductor devices.

SUMMARY OF THE INVENTION

An object is, therefore, to provide a method of starting and ending circular drill motions with specifiable beam positioner accelerations.

Another object is to provide a method for generating various new tool patterns.

A further object is to provide a method for adjusting tool pattern parameters for achieving uniform removal of hole material.

Still another object is to provide a method for controlling laser firing patterns and timing for performing workpiece processing.

Yet another object is to provide a method for synchronizing laser firing with arbitrary tool positions on a workpiece.

The following embodiments generate tool pattern movement commands for operating a laser beam positioner and for timing associated laser firing commands. The following aspects are identified by numbers that match the numbers identifying the corresponding problems set forth above as background information.

1. Preferred tool patterns reduce beam positioner acceleration and jerk problems by approaching hole locations from outside the center of the hole. During the approach movement, a move segment, referred to as a dt/2 segment, has a duration equal to one-half of the circular segment duration and has zero acceleration. This approach movement results in much less servo error. Because the tool velocity is constrained by the square root of available acceleration, this hole approaching method allows tool velocity to be increased by 41%, unless constrained by other factors. The removal of high acceleration from the dt/2 segment also allows the maximum circular oscillatory frequency to be increased while maintaining hole drilling quality. The ratio of the dt/2 segment acceleration to circular acceleration when drilling is defined as a factor $\alpha$. As $\alpha$ is increased, the initial hole position moves toward the center of the hole, with $\alpha=2$ representing the prior art startup position. For $\alpha=0$, the dt/2 segment has the preferred zero relative acceleration.

2. The tool patterns support outward spiraling, inward spiraling, and combined outward and inward spiraling, all executed without turning laser pulsing off between move segments. Inward spiraling is often better for processing glass reinforced materials, such as nonhomogeneous glass reinforced etched-circuit board material.

3. The tool patterns can execute spiral and repeated perimeter processing in a single step without turning off laser pulsing.

4. Positioner settling time is user programmable and is spent by the beam positioner tracing the circular path of the initial hole diameter to be processed, which tracing does not limit the beam positioner field.

5. The above-described settling time improvement also causes settling to occur while the beam positioner is oscillating, so transients from slewing to oscillatory motion are spent settling rather than processing.

6. The tool patterns employ an improved method for handling multiple repetitions of the tools. Rather than ending a circular motion with a generic move to set up the next repetition, this method maintains the oscillation with a 90 degree phase difference between the positioner axes, but turns off laser pulsing. This causes circular motion to continue while the move segment duration is adjusted until the entry condition of the next tool repetition is reached. The prior method required a laser-off time between repetitions equal to one-quarter the revolution time of the initial repetition, plus a generic move time, plus one-quarter the revolution time of the next repetition. This method requires at most a one-quarter revolution time of the initial repetition, plus a minimum drill time (drill-Tmin), plus a one-quarter revolution time of the next tool repetition. Minimum drill-Tmin is less than the generic move Tmin because of the small motion employed. Moreover, when the entry angle of the next repetition is 180-degrees offset from the exit angle of the initial repetition, the required laser-off time is only one-quarter the revolution time of the initial repetition plus one-quarter the revolution time of the next repetition.

7. When the tool patterns are used in a circle-at-perimeter-only mode, no laser pulses are placed inside the perimeter path, which eliminates the prior problems of unevenly distributed laser energy.

8. A beam positioner and laser synchronization method schedules laser firing signals for firing a first laser pulse before the beam positioner reaches the target hole location, so that the second laser pulse, which is the first pulse actually fired, lands where desired and all pulses commanded thereafter are delivered to the workpiece. This method further includes a "fractional laser delay" parameter that is added into the half-sine profiler parameter set for turning the laser on in the middle of an acceleration segment.

9. The tool patterns support an "incremental bite size" distribution of pulses on the hole perimeter that account for how many tool revolutions (repetitions) are executed at the perimeter. This optimizes the laser pulse distribution evenly and finely around the hole perimeter. The incremental bite size is defined as the distance along the perimeter between the first pulses delivered in the first and second revolutions (repetitions) of the tool. The incremental bite size method provides for automatically adjusting the tool velocity to set the incremental bite size to equal the laser bite size divided by the number of tool revolutions (repetitions).

Additional aspects and advantages of this invention will be apparent from the following detailed description of preferred embodiments, which proceeds with reference to the accompanying drawings.

BRIEF DESCRIPTION OF THE DRAWINGS

FIG. 5 is an XY plot representing an inward spiral tool pattern generated by a laser beam positioning method.

FIG. 6 is an XY plot representing an inward and outward spiral tool pattern generated by a laser beam positioning method.

FIG. 7 is an XY plot representing two repetitions of an outward spiral tool pattern generated by a laser beam positioning method.

DETAILED DESCRIPTION OF PREFERRED EMBODIMENTS

As mentioned in the background information section, to achieve high-speed, accurate positioning of a laser beam, positioner systems must control jerk, which is the rate of change of acceleration. Many prior positioner systems effected circular motion with a string of short interconnected linear moves. However, the sudden angular change at each interconnection produced unacceptably large jerks that limited speed and positioning accuracy.

Circular motion is fundamental in hole drilling applications, so employing sinusoidal positioner driving waveforms is preferred. In particular, preferred positioner driving waveforms employ half-sine-shaped acceleration segments that start and stop at a zero acceleration point. Each acceleration segment has a period TMIN that is the shortest non-zero acceleration half-sine segment within the acceleration capability of the positioner system and avoids positioner resonance problems.

Figure 1A:
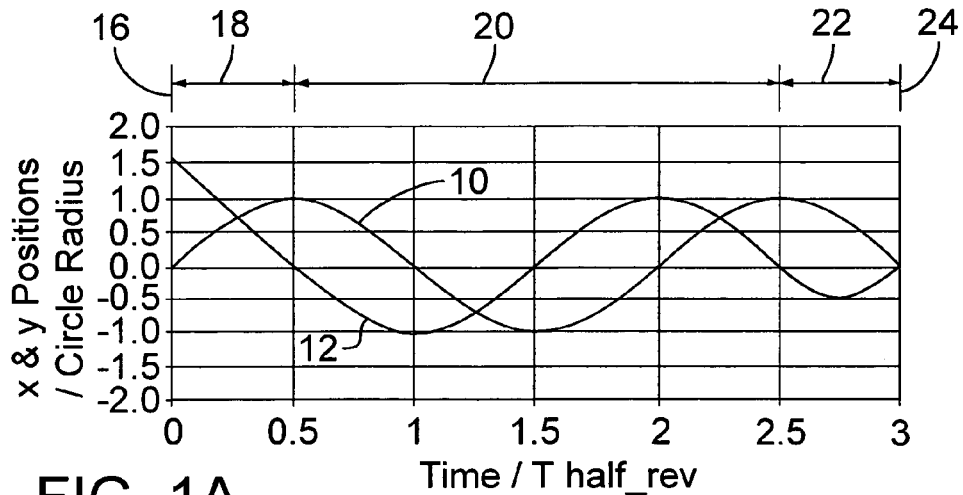
FIG. 1A is a graph representing a first set of X- and Y-axis positions versus time of a beam positioner for directing a laser beam along a tool pattern.
Figure 2A:
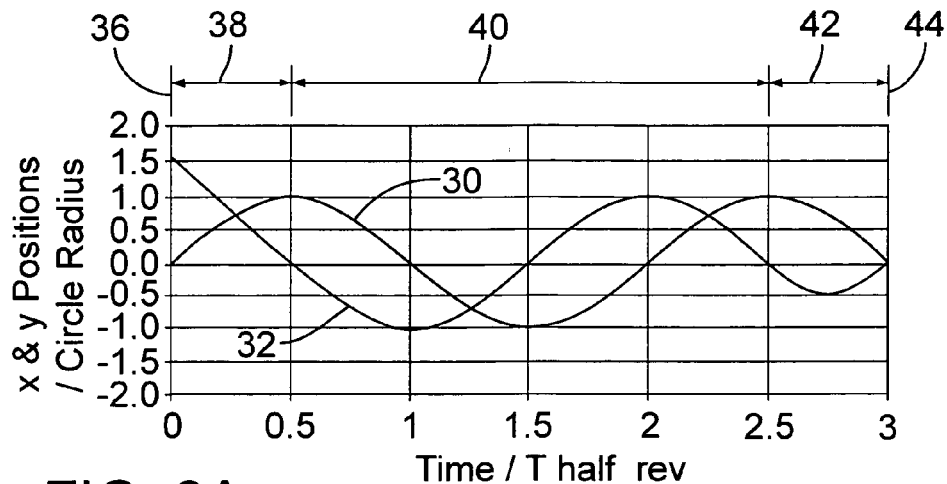
FIG. 2A is a graph representing a second set of X- and Y-axis positions versus time of a beam positioner for directing a laser beam along a tool pattern.

As shown in FIGS. 1A and 2A, circular motion is achieved by driving the orthogonal axes of a positioner with a pair of 90-degree phase shifted sinusoidal waveforms. For example, to form one complete circle starting from a 90-degree entry angle, the X-axis is driven by two half-sine acceleration segments, and the Y-axis is driven by three 90-degree phase shifted half-sine segments. The X-axis has "filler" segments, referred to as entry and exit segments, for separating hole processing from movement between hole locations.

A first aspect of this invention is, therefore, a method of starting and ending circular tool patterns with specifiable beam positioner accelerations on the dt/2 segments. Producing circular motion entails generating a pair of 90-degree phase-shifted sinusoidal motion waveforms for driving the beam positioner X and Y axes. Generating the 90-degree phase shift entails inserting a half-sine segment into one of the axes (which one depends on the tool pattern entry angle) with dt equal to one-half the dt of the circular motion segments. The phase-shifted segment is, therefore, referred to as the dt/2 segment. Users can specify the dt/2 segment acceleration from zero to twice the circular acceleration to trade off the initial beam position vs. acceleration required.

A factor $\alpha$ is defined as the ratio of the dt/2 segment acceleration to the circular perimeter acceleration. As $\alpha$ is increased, the initial beam position moves from outside the perimeter of circular motion toward the center of the hole to be processed, but the resulting acceleration also increases. For $\alpha=2$, the prior art startup motion and acceleration is produced. For $\alpha=0$, the dt/2 segment has a preferred zero acceleration relative to the circular motion.

FIGS. 1 and 2 illustrate the beam positioner motion for different values of $\alpha$. The value of $\alpha$ can be specified differently for the starting and ending dt/2 segments.

Figure 1B:
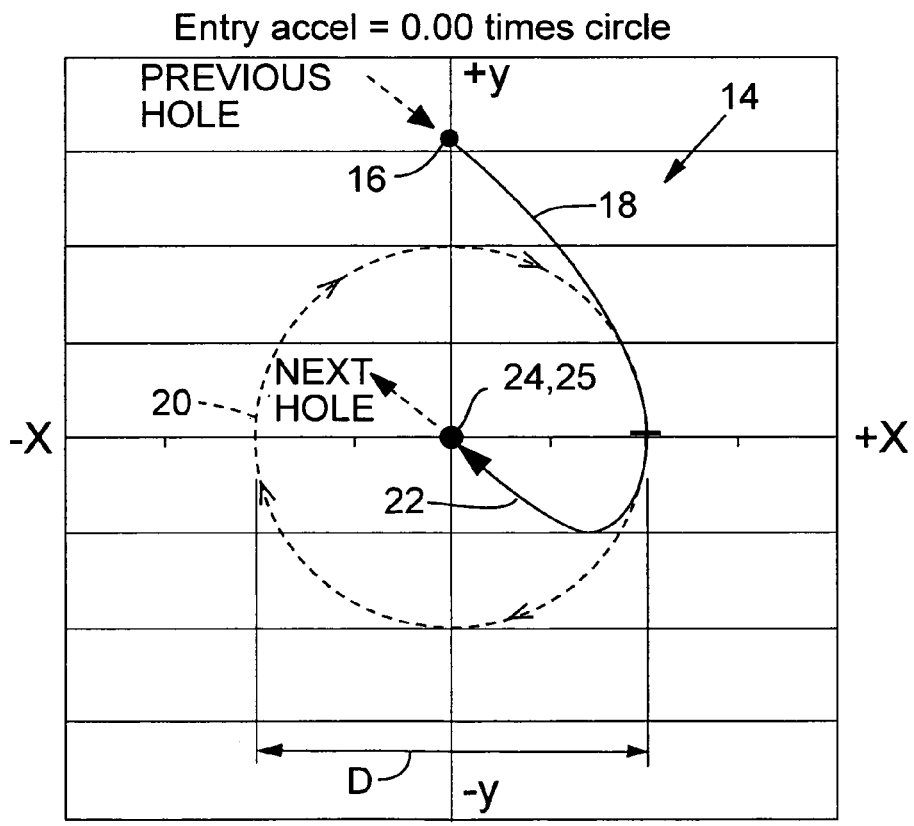
FIG. 1B is an XY plot representing the entry, circular, and exit segment laser beam motions resulting from the first set of X- and Y-axis beam positions of FIG. 1A.

FIGS. 1A and 1B show a first set of X-axis positions 10 and Y-axis positions 12 versus time of a beam positioner (not shown) for directing a laser beam axis along a tool pattern beam path 14. Beam path 14 starts at a starting location 16 (shown as a dot), includes an entry segment 18, a 360-degree circular segment 20 (shown in dashed lines), an exit segment 22, and an ending location 24 (shown as a dot), which is also a center 25 of circular segment 20. Circular segment 20 has a diameter D, corresponds to the perimeter or periphery of a hole to be processed, and can have other than a 360-degree extent. In this example, entry segment 18 has a set to zero, and exit segment 22 has $\alpha$ set to two. Therefore, the acceleration of entry segment 18 is zero (constant velocity), which is preferred, but the acceleration of exit segment 22 is twice the acceleration of circular segment 20.

Figure 2B:
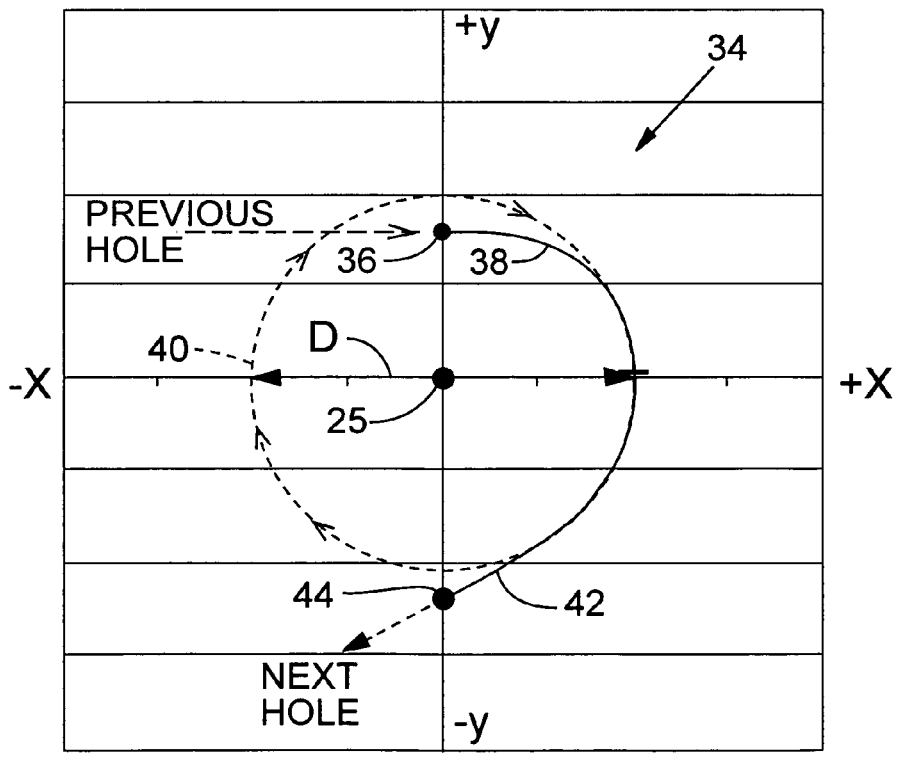
FIG. 2B is an XY plot representing the entry, circular, and exit segment laser beam motions resulting from the second set of X- and Y-axis beam positions of FIG. 2A.

FIGS. 2A and 2B show a second set of X-axis positions 30 and Y-axis positions 32 versus time of the beam positioner for directing the laser beam axis along a tool pattern beam path 34. Beam path 34 starts at a starting location 36 (shown as a dot), includes an entry segment 38, a 360-degree circular segment 40 (shown in dashed lines), an exit segment 42, and an ending location 44 (shown as a dot). In this example, entry segment 38 has $\alpha$ set to one, and exit segment 42 has $\alpha$ set to 0.5. Therefore, the acceleration of entry segment 38 is the same as the acceleration of circular segment 20, and the acceleration of exit segment 22 is one-half the acceleration of circular segment 20.

The tool patterns employ entry segments, such as entry segments 18 and 38, and employ exit segments, such as exit segment 42. A series of holes is processed in a workpiece by directing a laser beam axis along a pathway that links together the ending location of a previous hole and the starting location of a next hole. The entry and exit segment method allows tool movement velocity to be increased up to 41% over that achievable with prior methods.

A second aspect of this invention provides a method for generating half-sine parameters, such as X- and Y-axis positions 10, 12, 30, and 32 of FIGS. 1A and 2A, for executing various tool patterns. The parameters and method are described with reference to a Matlab code representation of the invention and several associated figures illustrating features of the tool patterns. Matlab is a model-based design simulation program that is available from The MathWorks of Natick, Mass. The Matlab code for generating the move segments is set forth in Appendix A.

Figure 3:
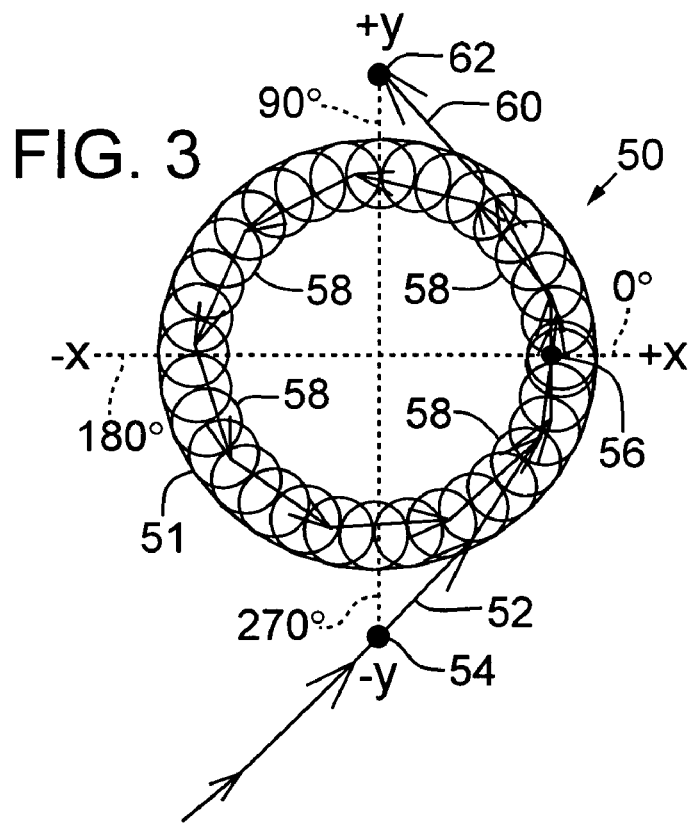
FIG. 3 is an XY plot representing an circular tool pattern generated by a laser beam positioning method.

FIG. 3 shows a circular tool pattern 50 generated by the method. Circular tool pattern 50 is employed for excising holes in a material by cutting around a periphery 51 of the hole being processed. When employing the tool patterns, each hole is processed with reference to degrees of rotation about an X-Y coordinate axis, where the +X, +Y, −X, and −Y axes are oriented, respectively at 0, 90, 180, and 270 degrees.

Circular tool pattern 50 includes an entry segment 52 having a starting location 54 at 270-degrees and an entry location 56 at 0-degrees, where laser pulses 58 are initiated.

In this example, the hole being processed has a 125 μm diameter, and laser pulses 58 have a 20 μm effective spot size. A 10.25 μm laser bite size results in 33 of laser pulses 58 being distributed within periphery 51 during a single 360-degree repetition of tool pattern 50 starting and ending at entry location 56. Laser pulses 58 are turned off and tool pattern 50 follows an exit segment 60 to an ending location 62 at 90-degrees.

Skilled workers will recognize that the angular locations of entry and exit segments 52 and 60 represent merely one exemplary set of relative angles that may be offset about the X and Y axes depending on the relative locations of prior and subsequent holes to be processed. For example, entry segment 52 may start and end at 0- and 90-degrees and, therefore, exit segment 60 may start and end at 90- and 180-degrees.

Typical positioner, laser, and hole parameters associated with tool pattern 50 include a tool velocity of 717 mm/sec, a laser pulse repetition frequency ("PRF") of 70 KHz, a positioner maximum acceleration of 1,000 Gs, a via drilling time of 0.47 msec, and a via minimum move time of 0.7 msec, resulting in a maximum via processing rate of 855 vias/sec.

Figure 4:
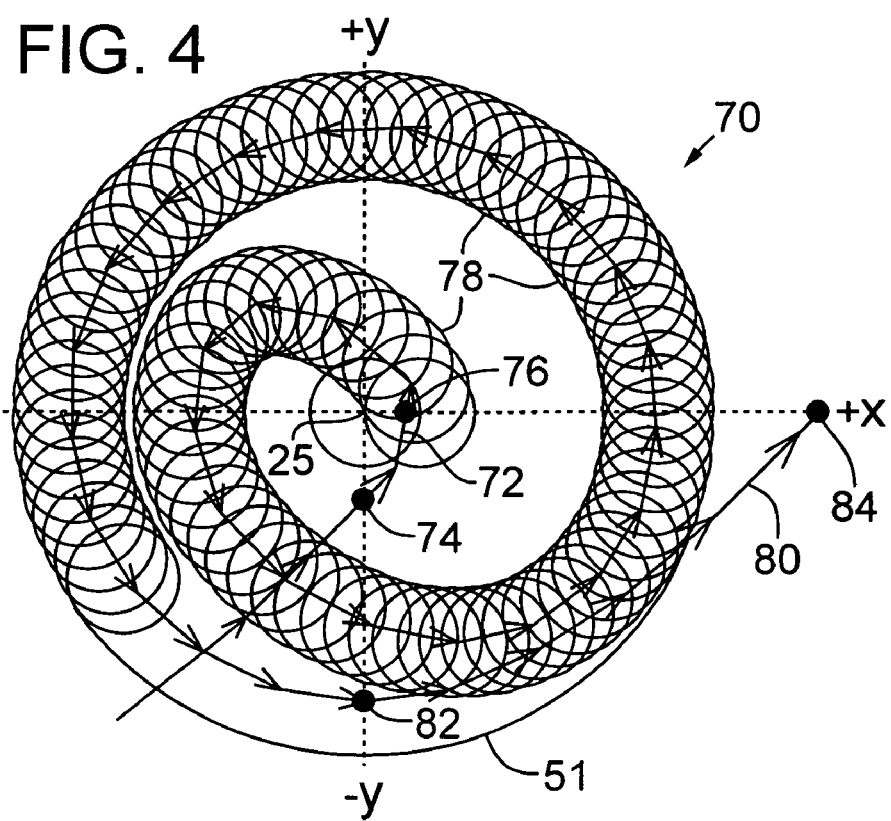
FIG. 4 is an XY plot representing an outward spiral tool pattern generated by a laser beam positioning method.

FIG. 4 shows an outward spiral tool pattern 70 generated by the method. Outward spiral tool pattern 70 is employed for drilling holes in a material by ablating material from center 25 along a curvilinear path progressively away from center 25 toward periphery 51 of each hole being processed. Outward spiral tool pattern 70 includes an entry segment 72 having a starting location 74 at 270-degrees and an entry location 76 at 0-degrees, where laser pulses 78 are initiated. In this example, the hole being processed has a 125 μm diameter, and laser pulses 78 have a 20 μm effective spot size and a 4.47 μm laser bite size. There are 89 laser pulses 78 distributed during a single repetition of tool pattern 70 starting at entry location 76, spiraling outward for one 360-degree rotation, and processing within periphery 51 from 0-degrees to about 216-degrees, at which point laser pulses 78 are turned off to prevent overlap with previously processed locations. Tool pattern 70 follows an exit segment 80 having a starting location 82 at 270-degrees to an ending location 84 at 0-degrees.

Skilled workers will again recognize that the angular locations of entry and exit segments 72 and 80 represent merely one exemplary set of relative angles that may be offset about the X and Y axes depending on the relative locations of prior and subsequent holes to be processed. For example, entry segment 72 may start and end at 0- and 90-degrees and, therefore, exit segment 80 may start and end at 0- and 90-degrees.

Typical positioner, laser, and hole parameters associated with tool pattern 70 include a tool velocity of 313 mm/sec, a laser PRF of 70 KHz, a positioner maximum acceleration of 1,000 Gs, a via drilling time of 1.27 msec, and a via minimum move time of 0.99 msec, resulting in a maximum via processing rate of 442 vias/sec.

FIG. 5 shows an inward spiral tool pattern 90 generated by the method. Inward spiral tool pattern 90 is employed for drilling holes in a material by ablating material from periphery 51 along a curvilinear path progressively inward from periphery 51 toward center 25 of each hole being processed. Inward spiral tool pattern 90 includes an entry segment 92 having a starting location 94 at 90-degrees and an entry location 96 at 180-degrees, where laser pulses 98 are initiated. In this example, the hole being processed has a 125 μm diameter, and laser pulses 98 have a 20 μm effective spot size, and a 4.47 μm laser bite size. There are 273 laser pulses 98 distributed during a single repetition of tool pattern 90 starting at entry location 96, processing two and one-half revolutions (900-degrees) within periphery 51 starting at 180-degrees and ending at 0-degrees, spiraling inward for two 360-degree revolutions starting and ending at 0-degrees, at which point laser pulses 98 are turned off. Tool pattern 90 follows an exit segment 100 having a starting location 102 at 0-degrees to an ending location 104 at 90-degrees.

Skilled workers will again recognize that the angular locations of entry and exit segments 92 and 100 represent merely one exemplary set of relative angles that may be offset about the X and Y axes depending on the relative locations of prior and subsequent holes to be processed. For example, entry segment 92 may start and end at 270- and 0-degrees and, therefore, exit segment 100 may start and end at 90- and 180-degrees.

Typical positioner, laser, and hole parameters associated with tool pattern 90 include a tool velocity of 313 mm/sec, a laser PRF of 70 KHz, a positioner maximum acceleration of 1,000 Gs, a via drilling time of 3.9 msec, and a via minimum move time of 0.85 msec, resulting in a maximum via processing rate of 211 vias/sec.

FIG. 6 shows an inward and outward spiral tool pattern 110 generated by the method. Inward and outward spiral tool pattern 110 is employed for drilling holes in a material by ablating material from periphery 51 inward to the center of each hole being processed and back outward to periphery 51. Inward and outward spiral tool pattern 110 includes an entry segment 112 having a starting location 114 at 180-degrees and an entry location 116 at 270-degrees, where laser pulses 118 are initiated. In this example, the hole being processed has a 125 μm diameter, and laser pulses 118 have a 20 μm effective spot size and a 4.47 μm laser bite size. There are 132 laser pulses 118 distributed during a single repetition of tool pattern 110 starting at entry location 116, processing one-quarter revolution (90-degrees) within periphery 51 starting at 270-degrees and ending at 0-degrees, spiraling inward for one 360-degree revolution starting and ending at 0-degrees, processing one-half revolution from 0-degrees to 180 degrees about the center of the hole, spiraling outward for one 360-degree revolution starting and ending at 180-degrees, and processing one-quarter revolution from 180-degrees to 270-degrees within periphery 51, at which point laser pulses 118 are turned off. Tool pattern 110 follows an exit segment 120 having a starting location 122 at 270-degrees to an ending location 124 at 0-degrees.

Skilled workers will again recognize that the angular locations of entry and exit segments 112 and 120 represent merely one exemplary set of relative angles that may be offset about the X and Y axes depending on the relative locations of prior and subsequent holes to be processed.

Typical positioner, laser, and hole parameters associated with tool pattern 110 include a tool velocity of 313 mm/sec, a laser PRF of 70 KHz, a positioner maximum acceleration of 1,000 Gs, a via drilling time of 1.88 msec, and a via minimum move time of 1.03 msec, resulting in a maximum via processing rate of 434 vias/sec.

FIG. 7 shows two repetitions of outward spiral tool pattern 70 (two repetitions referred to as 70') generated by the method. (Tool pattern 70' is shown with half-sized laser spots to more clearly show the entry and exit segment trajectories.) Outward spiral tool pattern 70' is employed for drilling holes in a material by repeatedly ablating material from the center outward to periphery 51 of each hole being processed. Outward spiral tool pattern 70' includes an entry segment 72' having a starting location 74' at 270-degrees and an entry location 76' at 0-degrees, where laser pulses 78' are initiated. In this example, the hole being processed has a 200 µm diameter, and laser pulses 78 have a 10 µm effective spot size and a 4.47 µm laser bite size. There are 216 laser pulses 78' distributed during the two repetition of tool pattern 70', the first repetition starting at first entry location 76', spiraling outward for one 360-degree rotation to 0-degrees, and processing within periphery 51 from 0-degrees to about 90-degrees, at which point laser pulses 78' are turned off and tool pattern 70' follows a transition segment 80' having a starting location 82' at 90-degrees and generally spiraling inward to an transition ending location 84' at 180-degrees. The second repetition of the tool pattern 70' starts at transition ending location 84', spiraling outward for one 360-degree rotation to 180-degrees, and processing within periphery 51 from 180-degrees to 270-degrees, at which point laser pulses 78' are turned off again and tool pattern 70' follows an exit segment 80'' having a starting location 82'' at 270-degrees to an ending location 84'' at 0-degrees.

Skilled workers will again recognize that the angular locations of entry and exit segments 72 and 80 represent merely one exemplary set of relative angles that may be offset about the X and Y axes depending on the relative locations of prior and subsequent holes to be processed.

Typical positioner, laser, and hole parameters associated with tool pattern 70' include a tool velocity of 313 mm/sec, a laser PRF of 70 KHz, a positioner maximum acceleration of 1,000 Gs, a via drilling time of 3.08 msec, and a via minimum move time of 1.69 msec, resulting in a maximum via processing rate of 209 vias/sec.

A third aspect of this invention provides a method for adjusting the laser beam movement velocity to achieve a uniform laser energy distribution while processing holes. When processing vias using multiple repetitions of, for example, circular tool pattern 50 (FIG. 3), processing good quality holes depends on slightly overlapping the laser spots of each subsequent repetition. The degree of overlap from repetition to repetition is determined by a parameter referred to as "incremental bite size." The incremental bite size is defined as the distance that the laser pulse locations shift between repetitions of a circular tool pattern.

Small changes in laser beam velocity can significantly change the repetition-to-repetition pulse overlap, or incremental bite size. Good via processing depends on shifting the locations of the laser pulses slightly for each repetition of the circular tool pattern so that laser pulses do not hit the same spot during subsequent repetitions and the laser energy is more uniformly spread around the via periphery.

For example, if a via processing application employs five circular repetitions, it is preferred that the laser pulses shift for each repetition so that a hypothetical sixth repetition has pulses that exactly overlap the first repetition pulses (the incremental bite size is approximately equal to the bite size divided by the number of circular repetitions). In contrast, poor via processing results when the pulses from each repetition impinge on the same locations. This is typically caused by inadvertently employing an incremental bite size that is very small relative to or approximately equal to the actual bite size.

Figure 8:
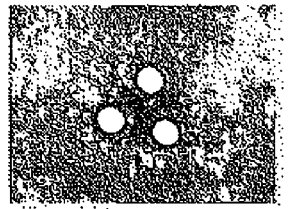
FIG. 8 is a photograph of an unacceptable etched-circuit board via processed with multiple repetitions of a prior art trepan tool pattern employing a very small incremental bite size.
Figure 9:
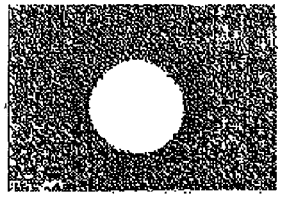
FIG. 9 is a photograph of a high-quality etched-circuit board via processed with multiple repetitions of a circular tool pattern employing an incremental bite size chosen in accordance with a pulsed laser emission method.

FIGS. 8 and 9 show respective unacceptable and high-quality vias processed in etched-circuit board material by multiple repetitions of trepan and circular tool patterns employing, respectively, a prior art bite size and a preferred calculated incremental bite size.

Figure 10:
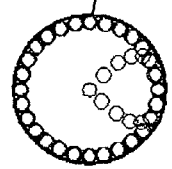
FIG. 10 is an XY plot representing a via processed by five repetitions of a prior art trepan tool pattern employing a prior art tool velocity.
Figure 11:
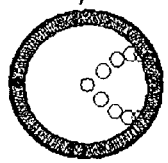
FIG. 11 is an XY plot representing a via processed by five repetitions of a circular tool pattern employing a calculated tool velocity.

FIGS. 10 and 11 show how the incremental bite size is affected by small changes in laser beam velocity. FIG. 10 shows a prior art bite size resulting by employing five repetitions of a trepan tool pattern in which the laser PRF is 30 kHz, the via diameter is 125 µm, the effective laser beam spot size is 13 µm, and the laser beam velocity is 377.5 mm/s. FIG. 10 shows that the laser pulses from each of the five trepan repetitions almost exactly overlap, resulting in a poor-quality via and/or poor trepan processing robustness. In contrast, FIG. 11 shows the same process except that the laser beam velocity is changed slightly to 379.5 mm/s. The small 2 mm/sec velocity change causes a uniform distribution of laser pulses about the via periphery, resulting in a high-quality via and/or improved process robustness. The circular process of FIG. 11 employed a 2.3 µm incremental bite size, which causes laser pulses from the hypothetical sixth repetition to overlap laser pulses from the first repetition.

The laser beam velocity needed for properly setting the incremental bite size associated with a particular circular tool pattern depends on the number of repetitions employed, the via diameter, the laser PRF, and the effective laser beam spot size. The laser beam velocity is preferably chosen such that the laser beam pulse locations of the first and hypothetical last plus one tool pattern repetitions substantially overlap.

Shown below are equations that are employed for calculating the incremental bite size ($\Delta_{rep}$) required for overlapping the laser pulse locations of the first and hypothetical last plus one tool pattern repetitions as a function of the number of circular tool repetitions (Cycles):

$$\text{Definition Bite} = \frac{v}{PRF} \qquad \text{(Eq. 1)}$$

$$\text{Definition } \Delta_{rep} = (N_{rep})(\text{Bite}) - \pi(D - \text{Eff}) \qquad \text{(Eq. 2)}$$

$$\text{Therefore } \Delta_{rep} = \frac{\text{Bite}}{\text{Cycles}}, \qquad \text{(Eq. 3)}$$

where:

Bite=Bite size (not incremental bite size) in µm;

v=Tool velocity in mm/sec;

PRF=Laser pulse repetition rate in kHz;

$N_{rep}$=Number of pulses in one circular repetition;

D=Via diameter in µm;

Eff=Effective spot size in µm;

$\Delta_{rep}$=Incremental bite size in µm; and

Cycles=Number of circular repetitions employed.

Appendix B sets forth a Matlab coded method, based on equations Eq. 1 to Eq. 3, for adjusting the incremental bite size to achieve equalized pulse spacing when employing multiple repetitions of a circular tool pattern. The method is executed when a user actuates an "Equalize Perimeter Pulse Overlap" button or other actuator. The method adjusts the tool velocity and, therefore, the bite size downward a small amount to achieve the desired incremental bite size without significantly changing the laser pulse energy density.

Of course, the incremental bite size can be adjusted by changing any combination of the tool velocity, PRF, and effective spot size, which corresponds to changing the hole diameter. Therefore, a more rigorous mathematical description of incremental bite size is set forth below.

The effective hole diameter is defined by:

$$D_{eff} = D - \text{Eff}. \qquad \text{(Eq. 4)}$$

The generalized equation for incremental bite size is:

$$\Delta_{rep} = \text{ceil}\left(\frac{\pi(D_{eff})(PRF)}{v}\right)\frac{v}{PRF} - \pi D_{eff}, \quad \text{(Eq. 5)}$$

where the function ceil(w) returns the smallest integer that is greater than or equal to w, and represents the process of rounding up a fractional number.

The condition for achieving an evenly divided incremental bite size is:

$$\Delta_{rep} = \frac{v}{(PRF)(\text{Cycles})}. \quad \text{(Eq. 6)}$$

Equations 4 to 6 can be combined to yield equation 7:

$$\text{ceil}\left(\frac{\pi(D_{eff})(PRF)}{v}\right) - \frac{\pi D_{eff}(PRF)}{v} = \frac{1}{\text{Cycles}} \quad \text{(Eq. 7)}$$

A quantity "x" is defined by Eq. 8:

$$x = \frac{\pi(D_{eff})(PRF)}{v}. \quad \text{(Eq. 8)}$$

Solving equation (7) is the same as solving equation 9:

$$\text{ceil}(x) - x = \frac{1}{\text{Cycles}}. \quad \text{(Eq. 9)}$$

Equation (9) has an infinite solution set in which any positive number with a fractional remainder of $$1 - \frac{1}{\text{Cycles}}$$

yields a solution. The preferred case yields the smallest possible adjustment, further constrained by the rotational direction. When making the adjustment, the quantity x can be adjusted upward or downward. The smaller of the changes is preferred, although practical constraints on achievable velocity and PRF may dictate a certain direction of adjustment.

The solution for adjusting x upward the minimum amount to solve equation 9 is shown below in equation 10:

$$x_{new} = \text{ceil}\left(x + \frac{1}{\text{Cycles}}\right) - \frac{1}{\text{Cycles}}. \quad \text{(Eq. 10)}$$

The solution for adjusting x downward the minimum amount to solve equation 9 is shown below in equation 11:

$$x_{new} = \text{floor}\left(x + \frac{1}{\text{Cycles}}\right) - \frac{1}{\text{Cycles}}. \quad \text{(Eq. 11)}$$

Once the preferred mathematical adjustment has been determined, the incremental bite size can be effected by altering the velocity, PRF, diameter, or effective spot size, according to equation 8. Solving for incremental bite size by adjusting the velocity is shown below in equation 12:

$$v_{new} = \frac{\pi(D_{eff})(PRF)}{x_{new}}. \quad \text{(Eq. 12)}$$

Solving for incremental bite size by adjusting the PRF is shown below in equation 13:

$$PRF_{new} = \frac{v x_{new}}{\pi(D_{eff})}. \quad \text{(Eq. 13)}$$

Solving for incremental bit size by adjusting the effective hole diameter is shown below in equation 14:

$$D_{eff,new} = \frac{v x_{new}}{\pi(PRF)}. \quad \text{(Eq. 14)}$$

Of course, the effective diameter can be altered by changing a combination of the hole diameter and the effective spot size. However, because changing the effective diameter slightly modifies the laser via size, and changing the PRF has undesirable implications for laser setup and control overhead, the incremental bite size is preferred determined by employing equation 12 for adjusting the beam positioner velocity.

When determining the incremental bite size, the pulse spacing need not be exact to achieve suitable via processing results. For example, $\Delta_{rep}$ may be increased by up to about 20 percent. Moreover, in some specimen processing applications, $\Delta_{rep}$ may result in a pulse spacing less than 5 um. In such applications, the spacing between laser pulses should be no less than about 1.0 um.

Figure 12:
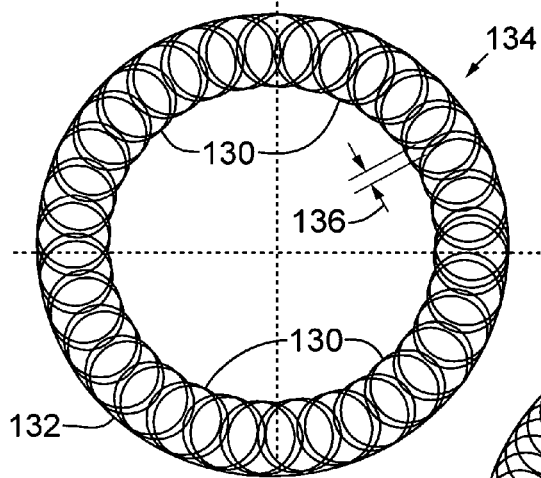
FIG. 12 is an XY plot representing laser pulses unevenly distributed around the perimeter of hole by two repetitions of a prior art trepan tool pattern.
Figure 13:
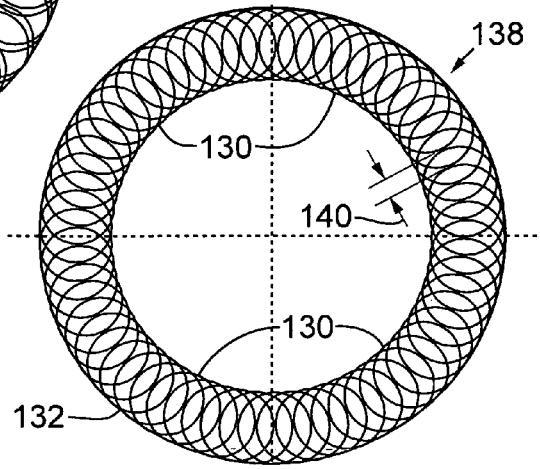
FIG. 13 is an XY plot representing laser pulses evenly distributed around the perimeter of hole by two repetitions of a circular tool pattern employing an "Equalize Perimeter Pulse Overlap" method.

FIGS. 12 and 13 show a comparative relationship between trepan and circular tool patterns formed in accordance with, respectively, the prior art and this method. In particular, FIG. 12 shows laser pulses 130 unevenly distributed around a periphery 132 of a hole by two repetitions of a prior art trepan tool pattern 134. Trepan tool pattern 134 employs a 717 mm/sec laser beam velocity, a 70 kHz laser PRF, a 125 μm hole diameter, a 20 μm effective spot size, a 10.24 μm laser bite size, and an 8.15 μm bite size 136.

In contrast, FIG. 13 shows laser pulses 130 evenly distributed around periphery 132 of the hole by two repetitions of a circular tool pattern 138 employing an "Equalize Perimeter Pulse Overlap" method. Circular tool pattern 138 employs a 710.5 mm/sec laser beam velocity, a 70 kHz laser PRF, a 125 μm hole diameter, a 20 μm effective spot size, a 10.15 μm laser bite size, and a 5.07 μm incremental bite size 139. Employing the "Equalize Perimeter Pulse Overlap" method changes the laser beam velocity from 717 mm/sec to 710.5 mm/sec.

A fourth aspect of this invention provides a method for controlling a Q-switched laser that emits laser beam pulses employed by the above-described tool patterns. The method executes on a logic apparatus, such as a microprocessor of a digital signal processor ("DSP") including registers for controlling a field programmable gate array ("FPGA") that precisely schedules emission of a first laser pulse and emissions of all subsequent laser pulses relative to half-sine profiler commands driving a laser beam positioner. Exemplary profiler commands may include commands required to position a laser beam along the tool pattern segments described above.

Figure 14:
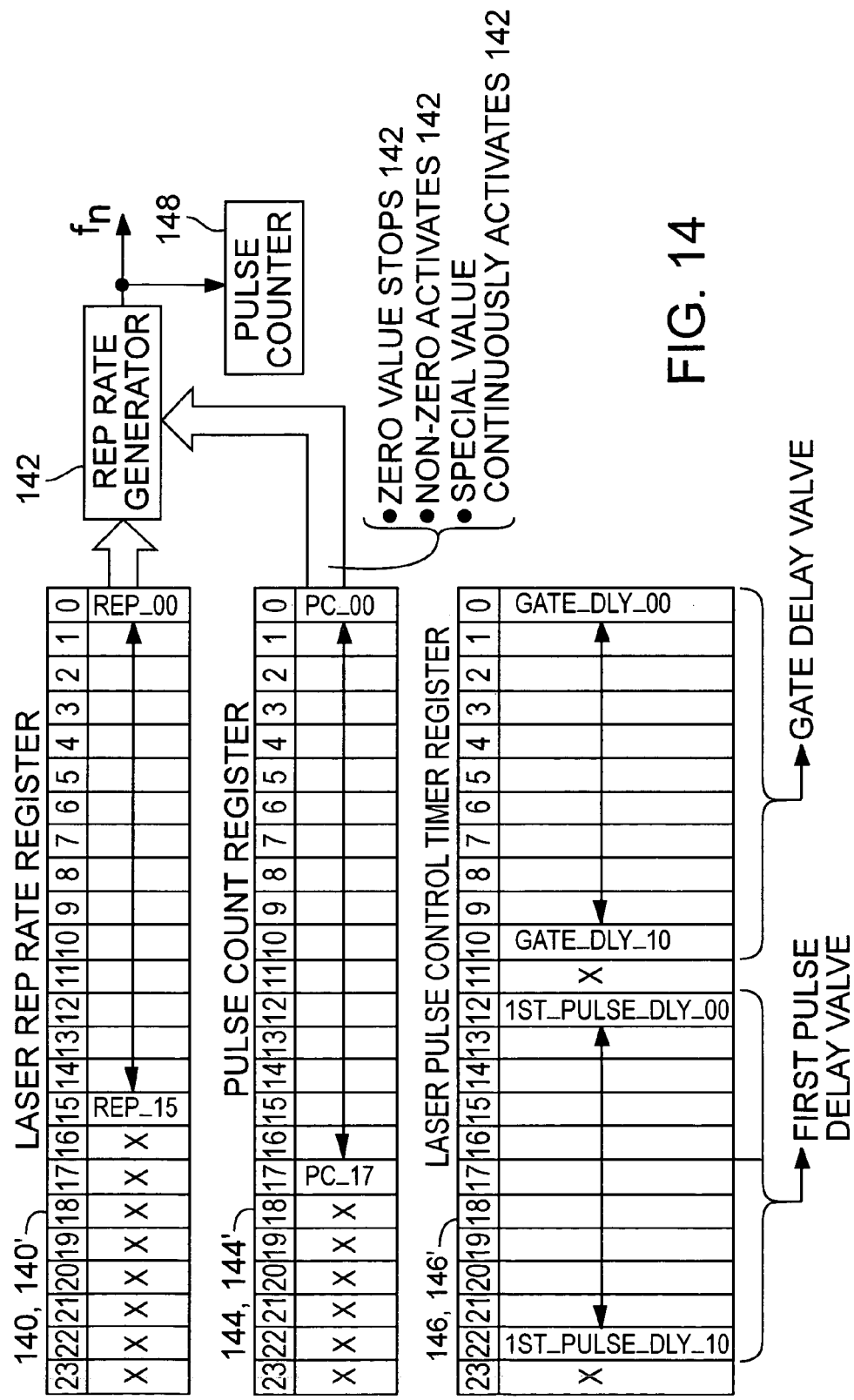
FIG. 14 is a simplified electrical block diagram representing register structures controlling and supporting the above methods.

FIG. 14 shows a first DSP register, which is a "Laser Rep Rate Register" 140 that includes 16 read/write locations for programming the laser interpulse period. Laser Rep Rate Register 140 controls a rep rate generator 142 that provides a signal having a frequency fn ranging from 305.18 Hz (register 140 value 0xFFFF) to 2.0 MHz (register 140 value 0x0) with a resolution of about 0.0047 Hz. The signal frequency fn=1/(reg. value*50 nsec). Rep rate generator 142 is activated only when a DSP "Pulse Count Register" 144, described below, stores a non-zero value.

A second DSP register is a "Laser Pulse Control Timer Register" 146 that includes 24 read/write locations for programming two time delays associated with emitting laser pulses. Locations 0-10 program a gate delay, and locations 12-22 program a first pulse delay. Locations 12-22 are preferably shifted to normalize the value stored therein before applying the normalized value to the "dly" formula below. Each delay is determined by the formula, dly= (register 146 value*50 nsec) and ranges from 0 to 102.3 μsec.

A third DSP register is Pulse Count Register 144 that includes 18 read/write locations for programming a number of laser pulses that will be emitted in a burst of pulses. Valid register 144 values range from 0x3FFFF to 0. Values 0x3FFFF and 0x0 have special meanings. Valid values (1 through 0x3FFFE, 262142D) correspond to the number of pulses emitted in the burst. Special value 0x3FFFF causes a continuous burst of pulses until a zero value is written to Pulse Count Register 144. Special value 0x0 stops the current burst.

The method for initiating emissions of laser pulses is described below with reference to FIGS. 15A and 15B. Laser pulse commands are qualified by a watch-dog timer that stops emission of laser pulses if the DSP fails. Skilled workers will understand how to implement the logic apparatus for carrying out this laser control method.

Figure 15A:
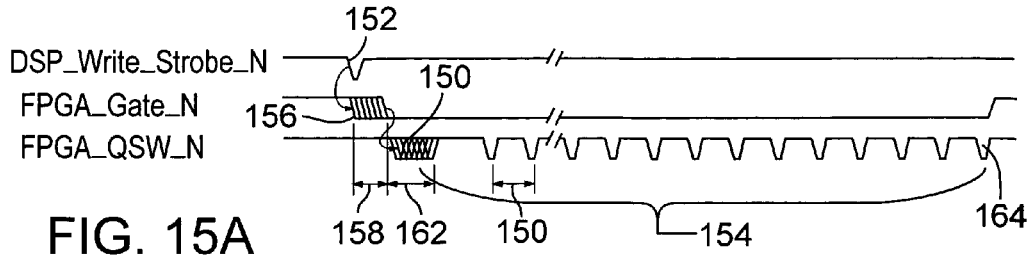
FIGS. 15A and 15B are electrical waveform timing diagrams representing respective normal and special-case timing relationships for firing laser pulses supporting the above methods.
Figure 15B:
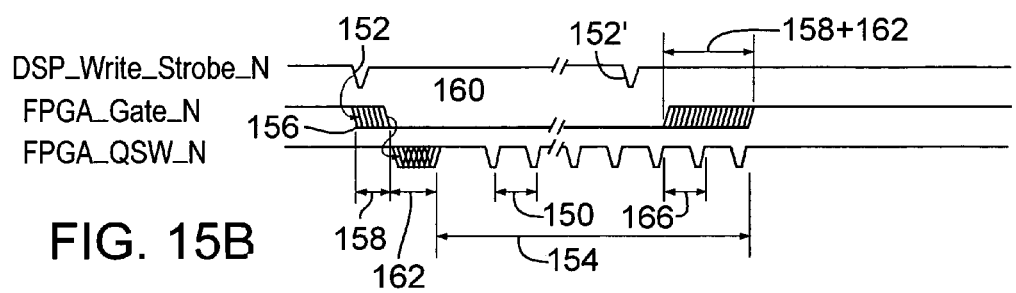

FIGS. 15A and 15B show respective normal and special-case timing relationships for emitting laser pulses supporting the above methods.

The normal timing relationships shown in FIG. 15A are carried out as follows:

Also referring to FIG. 14, the laser PRF is set by the DSP writing an interpulse period 150 to Laser Rep Rate Register 140.

Pulse Count Register 144 is initialized with a value of zero. The DSP initiates the laser pulsing process with a "DSP_Write_Strobe_N" write signal 152, which loads a number of pulses value (1 to 200,000) 154 into Laser Pulse Count Register 144.

An "FPGA_Gate_N" laser gate signal 156 goes true after an amount of gate delay (50 ns to 100 μs) 158 as determined by bits 00 to 10 of Laser Pulse Control Timer Register 146.

A first "FPGA_QSW_N" laser Q-Switch signal 160 goes true after an amount of first pulse delay (50 ns to 100 μs) 162 as determined by bits 12 to 22 of Laser Pulse Control Timer Register 146. The default first pulse delay 162 is zero.

The number of laser pulses 154 is programmed in Pulse Count Register 144 with the exception of the special case set forth below with reference to FIG. 15B. Laser gate signal 156 goes false 50 ns after a last laser pulse 164 causing a last laser pulse emission goes true.

The special-case timing relationships shown in FIG. 15B are carried out as follows:

Referring also to FIG. 14, the special timing case occurs when DSP write signal 152 loads a value 0x3FFFF into Pulse Count Register 144. This action causes a pulse counter 148 to count continuously until a DSP write signal 152' loads a zero value into Pulse Count Register 144, which causes laser Q-switch signal 160 pulses to stop after a one pulse uncertainty delay 166 to avoid race conditions plus the remainder of gate delay 158 and first pulse delay 162.

A fifth aspect of this invention entails a method for coordinating the emission of laser pulses and their incidence on predetermined laser beam positioning command locations. When employing the above-described tool patterns for processing holes, the emitted laser pulses are precisely positioned during a desired number of tool pattern repetitions and, in particular, to emit the first laser pulse of each repetition at the correct location of the tool pattern. Therefore, this method improves the coordination, accuracy, and performance of the motion profiler and laser timing employed by the above-described tool patterns.

This method supports the new tool patterns by providing a higher tool velocity for a given laser beam positioner acceleration limit. For example, a typical galvanometer-based beam positioner has a 1,000 G acceleration limit. The new tool patterns affect laser pulse emission timing in at least two ways. First, the circular tool pattern can start laser pulse emission in the middle of a move segment and allows laser pulsing during fractional portions of a tool repetition. Therefore, a portion of the laser beam positioner system, referred to as a coordinated motion control module ("CMCM"), coordinates with the system control computer to cause laser pulse emissions during predetermined fractions of a move segment. Second, the new mid-segment laser timing coupled with tool velocities approaching 1.0 m/sec requires very high laser pulse timing accuracy. Prior laser timing systems have about a ±50 μsec pulse first pulse timing resolution, which implies an unacceptable ±50 μm first pulse positioning.

Therefore, this method transfers the precise timing of laser pulses from DSP control to the much faster FPGA by transferring the contents of the DSP registers and related timing control to counterpart registers 140', 144', and 146' in the FPGA. Additionally, a new FractionalLaserDelay parameter is added to the move segment data structure for coordinating CMCM motion commands and laser pulse emission timing. The FractionalLaserDelay parameter defines a time delay between the start of a move segment and the first laser pulse emission, as a fraction of the total segment time ΔT. The FractionalLaserDelay parameter has an 8-bit value, with values from 0 to 255. If the value is zero, laser pulse timing behaves like the prior art. The delay from the start of a move segment to the first laser pulse is:

$$\text{Delay} = \Delta T * \text{FractionalLaserDelay}/256.$$

Figure 16:
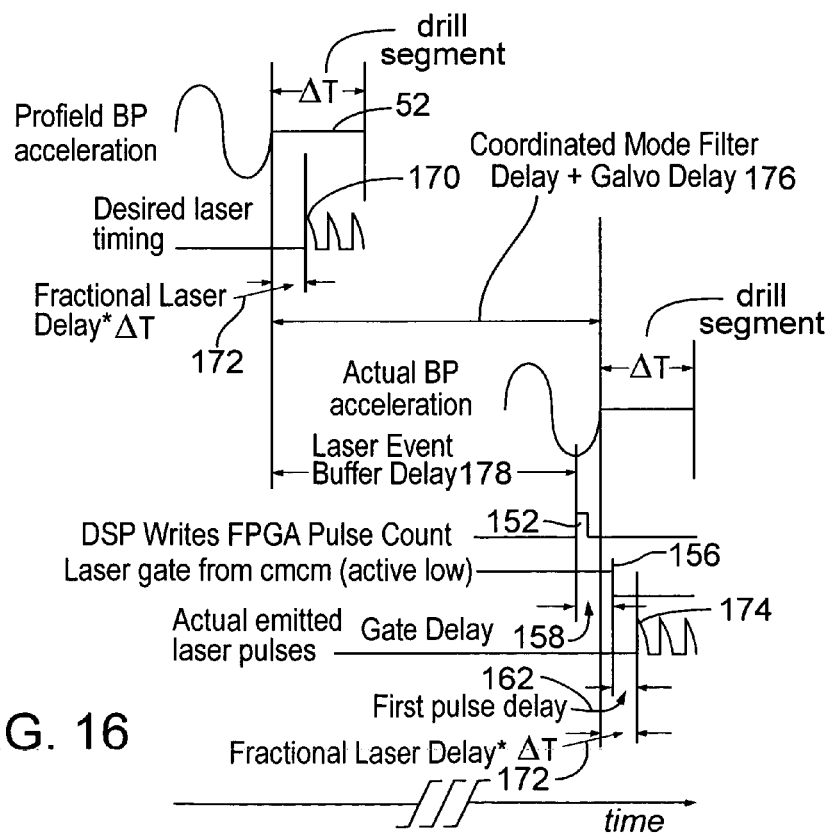
FIG. 16 is an electrical waveform timing diagram showing timing relationships among laser beam positioning commands, various system delays, and the laser beam pulsing.

FIG. 16 shows the laser beam pulsing and beam positioner ("BP") timing relationships. Ideally, emission of a first laser pulse 170 would occur a FractionalLaserDelay*ΔT time 172 after the beam positioner starts a tool pattern entry segment, such as entry segment 52 (FIG. 3). However, a number of system delays require a coordinated timing method for emission of an actual first laser pulse 174.

The coordinated timing method first accounts for a CoordinatedModeFilterDelay 176 that includes a profiling filter group delay and a galvanometer delay. The profiling filter group delay has a fixed value of 50-80 msec, depending on the filter frequency. Coordinated mode beam positioning and the associated group filter delay is described in U.S. Pat. No. 5,751,585 for HIGH SPEED, HIGH ACCURACY MULTI-STAGE TOOL POSITIONING SYSTEM, which is assigned to the assignee of this application. The GalvoDelay is the time required for the beam positioner command to reach the beam deflecting galvanometers. GalvoDelay is fixed at about 200 msec.

The coordinated timing method further accounts for a LaserEventBufferDelay 178 that includes the elapsed time between a profiled drill segment, such as entry segment 52 (FIG. 3), and the time commanded to start laser emission. LaserEventBufferDelay 178 can be adjusted to a resolution of 50 msec.

GateDelay 158 (also see FIGS. 15A and 15B) is stored in a first portion of FPGA Pulse Control Timer Register 146' and determines the FPGA delay between receiving the Pulse Count write signal 152 and activating laser gate signal 156 (also see FIGS. 14A and 14B). GateDelay 158 has a 50 nsec resolution.

FirstPulseDelay 162 (also see FIGS. 14A and 14B) is stored in a second portion of FPGA Pulse Control Timer Register 146' and determines the delay between laser gate signal 156 and first laser Q-switch signal 160 for requesting emission of the first actual laser pulse. FirstPulseDelay 162 is determined by 1/PRF+RuntDelay, where RuntDelay is a fixed delay required to avoid an abnormally low energy (runt) laser pulse.

Each time the DSP loads a new move segment, it computes LaserEventBufferDelay 178 and GateDelay 158 values as follows:

The value of CoordinatedModeFilterDelay+GalvoDelay is stored as a parameter named BPDelay.

Delay1=BPDelay+ΔT*FractionalLaserDelay−FirstPulseDelay. This is the delay required between LaserEventBufferDelay 178 and GateDelay 158.

GateDelay 158=(Delay1 modulus 50 msec)+50 msec. This delay ensures that GateDelay 158 is long enough to avoid FPGA boundary conditions.

LaserEventBufferDelay 178=Delay1−GateDelay 158. This is an even multiple of 50 msec.

After the values are computed, GateDelay 158 is loaded as a field in a LaserOn packet of the LaserEventBuffer, and a time tag for the packet is the current time plus LaserEventBufferDelay.

When the beam positioner servo calls a LaserOn packet, it loads the GateDelay 158 value into FPGA Laser Pulse Control Timer Register 146', then interrogates FPGA Pulse Count Register 144' to determine the desired number of laser pulses.

Skilled workers will recognize that portions of this invention may be implemented differently from the implementations described above for preferred embodiments. For example, workpiece specimen materials may include virtually any printed wiring board material, whether rigid or flexible, copper-clad or exposed, fiber reinforced, or homogeneous resin dielectric, and may also include ceramic substrates and silicon substrates, such as those employed in micro-electronic and semiconductor devices.

APPENDIX A

```
% generate the move segments
    function [x_segs, y_segs] = gen_segs(hole_diameter, eff_spot_size,
        spiral_revs, proc_action, spiral_id, velocity, repetitions,
        revs_at_diam, settle_revs, prf_period, init_entry_angle)
    % The preferred rotation direction is CCW. This is allowed by apps and minimizes the
        complexity of switch statements, etc. The true
        entry conditions, however, are determined by the settling revs and
        revs at hole diameter if the spiral action is inward.
    entry_angle = init_entry_angle;           % degrees for
      rep_ctr=1:repetitions
      % Compute the dt for the initial revolution
      if (proc_action==2)       % spiral outward
         dt_init = pi*spiral_id/2/velocity;
      else                      % starts at outer diameter
         dt_init = pi*(hole_diameter-eff_spot_size)/2/velocity;
      end
      dt = dt_init;
      % Compute how far off of the entry angle to start.
      pre_entry_angle_bp_revs = 0;
      if ((proc_action==3) | (proc_action==4))   % spiral inward or
      spiral inward, then outward
         pre_entry_angle_bp_revs = revs_at_diam;
      end
      % settle rev on the initial rep only
      if (rep_ctr == 1)
         pre_entry_angle_bp_revs = pre_entry_angle_bp_revs +
      settle_revs;
      end
      % figure the entry angle for starting the definition of bp motion
      pre_entry_angle_bp_revs_mod4 = ceil(pre_entry_angle_bp_revs*4)/4;
      entry_angle_bp = entry_angle − pre_entry_angle_bp_revs_mod4*360;
      entry_angle_bp = mod(entry_angle_bp,360);
      % Now start adding move segments. Note that the move segment
      format is:
      % [dp_um dv_umpersec dt_sec pulse_cnt pulse_frac_dly]
      % add the move segments pre entry angle
      % figure out the segment reference times for BP motion
      switch entry_angle_bp,
```

APPENDIX A-continued

```
    case 0,
        x_segs = [0 -2*velocity dt 0 0];    % leader is x axis
        x_ref_time = -dt/2;                 % x starts at time -dt/2
        x_total_dt = dt/2;
        y_segs = [0 0 0 0 0];
        y_ref_time = 0;                     % y starts at time zero
        y_total_dt = 0;
        vx = -velocity;
        vy = velocity;
    case 90,
        y_segs = [0 -2*velocity dt 0 0];    % leader is y axis
        y_ref_time = -dt/2;                 % x starts at time -dt/2
        y_total_dt = dt/2;
        x_segs = [0 0 0 0 0];
        x_ref_time = 0;                     % y starts at time zero
        x_total_dt = 0;
        vx = -velocity;
        vy = -velocity;
    case 180,
        x_segs = [0 2*velocity dt 0 0];     % leader is x axis
        x_ref_time = -dt/2;                 % x starts at time -dt/2
        x_total_dt = dt/2;
        y_segs = [0 0 0 0 0];
        y_ref_time = 0;                     % y starts at time zero
        y_total_dt = 0;
        vx = velocity;
        vy = -velocity;
    case 270,
        y_segs = [0 2*velocity dt 0 0];     % leader is y axis
        y_ref_time = -dt/2;                 % x starts at time -dt/2
        y_total_dt = dt/2;
        x_segs = [0 0 0 0 0];
        x_ref_time = 0;                     % y starts at time zero
        x_total_dt = 0;
        vx = velocity;
        vy = velocity;
    end
    % Now round and round for the rounded bp_revs. Each segment
    defines the next 1/4 of a revolution
    for seg_ctr=1:pre_entry_angle_bp_revs_mod4*4
        if (y_total_dt > x_total_dt)
            x_segs = [x_segs; 0 -2*vx dt 0 0];
            vx = -vx;
            x_total_dt = x_total_dt + dt;
        else
            y_segs = [y_segs; 0 -2*vy dt 0 0];
            vy = -vy;
            y_total_dt = y_total_dt + dt;
        end
    end
    % Motion is now defined up to the entry angle. Where to move next
    depends on the processing action.
    if ((proc_action==3) | (proc_action==4))    % spiral inward
        diam_inc = (spiral_id - (hole_diameter-
    eff_spot_size))/spiral_revs;
        dt_inc_seg = pi*diam_inc / (8*velocity);
        for seg_ctr=1:spiral_revs*4
            dt = dt + dt_inc_seg;
            if (y_total_dt > x_total_dt)
                x_segs = [x_segs; 0 -2*vx dt 0 0];
                vx = -vx;
                x_total_dt = x_total_dt + dt;
            else
                y_segs = [y_segs; 0 -2*vy dt 0 0];
                vy = -vy;
                y_total_dt = y_total_dt + dt;
            end
        end
    end
    % inward/outward includes extra 1/2 rev which will be at ID
    if (proc_action==4)
        for seg_ctr=1:2
            if (y_total_dt > x_total_dt)
                x_segs = [x_segs; 0 -2*vx dt 0 0];
                vx = -vx;
                x_total_dt = x_total_dt + dt;
            else
                y_segs = [y_segs; 0 -2*vy dt 0 0];
                vy = -vy;
```

APPENDIX A-continued

```
            y_total_dt = y_total_dt + dt;
        end
    end
end
if ((proc_action==2) | (proc_action==4))    % spiral outward
    diam_inc = ((hole_diameter-eff_spot_size) - spiral_id)/spiral_revs;
    dt_inc_seg = pi*diam_inc / (8*velocity);
    for seg_ctr=1:spiral_revs*4
        dt = dt + dt_inc_seg;
        if (y_total_dt > x_total_dt)
            x_segs = [x_segs; 0 -2*vx dt 0 0];
            vx = -vx;
            x_total_dt = x_total_dt + dt;
        else
            y_segs = [y_segs; 0 -2*vy dt 0 0];
            vy = -vy;
            y_total_dt = y_total_dt + dt;
        end
    end
end
if ((proc_action==1) | (proc_action==2) | (proc_action==4))    % do circular revs
    ncircle_segs = ceil(revs_at_diam*4);
    for seg_ctr=1:ncircle_segs
        if (y_total_dt > x_total_dt)
            x_segs = [x_segs; 0 -2*vx dt 0 0];
            vx = -vx;
            x_total_dt = x_total_dt + dt;
        else
            y_segs = [y_segs; 0 -2*vy dt 0 0];
            vy = -vy;
            y_total_dt = y_total_dt + dt;
        end
    end
end
% That defines the BP motion, besides the entry/exit which will be
handled later. Next thing to do is compute the number of laser
pulses and schedule the laser-on event in the move segments.
laser_delay_revs = pre_entry_angle_bp_revs_mod4;    % basic delay
% if spiral inward is first process action, back off the delay by
the revs at diameter
if ((proc_action==3) | (proc_action==4))
    laser_delay_revs = laser_delay_revs - revs_at_diam;
end
laser_delay_time = laser_delay_revs*dt_init*2;
% laser on time is equal to the minimum of the two total segment
times, then adjusted by the laser delay time and the difference
between the rounded up final revs and desired final revs
laser_on_time = min([x_total_dt y_total_dt]);
laser_on_time = laser_on_time - laser_delay_time;
if ((proc_action==1) | (proc_action==2) | (proc_action==4))    %
fractional revs at end
    bp_finish_up_time = (ceil(revs_at_diam*4)/4-revs_at_diam)*dt*2;
    laser_on_time = laser_on_time - bp_finish_up_time;
end
pulse_count = ceil(laser_on_time / prf_period);
% The laser-on event goes into the X segment stream
t_tracker = x_ref_time;
seg_idx = 1;
dtseg = x_segs(1,3);
while (t_tracker+dtseg <= laser_delay_time)
    t_tracker = t_tracker + dtseg;
    seg_idx = seg_idx+1;
    dtseg = x_segs(seg_idx, 3);
end
frac = (laser_delay_time - t_tracker)/dtseg;
% 1/256 resolution just like cmcm
frac = round(frac*256);
% Now stick it into the move segments
x_segs(seg_idx,4) = pulse_count;
x_segs(seg_idx,5) = frac;
% Need to pad the move segments with the entry.
% The first rep always enters with a generic move.
if (rep_ctr==1)
    switch entry_angle_bp,
        case 0,
            y_segs = [-x_ref_time*velocity 0 -x_ref_time 0 0; y_segs];
```

APPENDIX A-continued

```
      x0 = 0;
      y0 = x_ref_time*velocity;
      vx0 = velocity;
      vy0 = velocity;
   case 90,
      x_segs = [y_ref_time*velocity 0 -y_ref_time 0 0; x_segs];
      x0 = -y_ref_time*velocity;
      y0 = 0;
      vx0 = -velocity;
      vy0 = velocity;
   case 180,
      y_segs = [x_ref_time*velocity 0 -x_ref_time 0 0; y_segs];
      x0 = 0;
      y0 = -x_ref_time*velocity;
      vx0 = -velocity;
      vy0 = -velocity;
   case 270,
      x_segs = [-y_ref_time*velocity 0 -y_ref_time 0 0; x_segs];
      x0 = y_ref_time*velocity;
      y0 = 0;
      vx0 = velocity;
      vy0 = -velocity;
   end
   % generic move from hole center. Create generic move segments
from current position to initial conditions for the via
   [(gmt_x, Apk, Vpk] = gm_new(x0, 0, vx0);
   [gmt_y, Apk, Vpk] = gm_new(y0, 0, vy0);
   % Take max of move times for two cases.
   gmt = max([gmt_x; gmt_y]);
   % Round up to modulus of 50 usec
   rup = 50e-6 - mod(sum(x_segs(:,3))+sum(gmt),50e-6);   % x, y
same dt
   rup = mod(rup, 50e-6);
   gmt(2) = gmt(2) + rup;
   % compute generic move dvs and dps
   init_x = x0;
   x = 0;
   init_y = y0;
   y = 0;
   vx_start = 0;
   vy_start = 0;
   init_vx = vx0;
   init_vy = vy0;
   denom=(gmt(1)+2*gmt(2)+gmt(3));
   dvx1 = (2*(init_x-x)-vx_start*(2*gmt(1)+2*gmt(2)+gmt(3))-
init_vx*gmt(3))/denom;
   dvy1 = (2*(init_y-y)-vy_start*(2*gmt(1)+2*gmt(2)+gmt(3))-
init_vy*gmt(3))/denom;
   dvx3 = (-2*(init_x-
x)+vx_start*gmt(1)+init_vx*(gmt(1)+2*gmt(2)+2*gmt(3)))/denom;
   dvy3 = (-2*(init_y-
y)+vy_start*gmt(1)+init_vy*(gmt(1)+2*gmt(2)+2*gmt(3)))/denom;
   dpx1 = gmt(1)*(vx_start+dvx1/2);
   dpy1 = gmt(1)*(vy_start+dvy1/2);
   dpx2 = gmt(2)*(vx_start+dvx1);
   dpy2 = gmt(2)*(vy_start+dvy1);
   dpx3 = init_x-x-dpx1-dpx2;
   dpy3 = init_y-y-dpy1-dpy2;
   % pre-pend the generic move segments
   x_segs = [      dpx1 dvx1 gmt(1) 0 0;
                   dpx2 0 gmt(2) 0 0;
                   dpx3 dvx3 gmt(3) 0 0;
                   x_segs ];
   y_segs = [      dpy1 dvy1 gmt(1) 0 0;
                   dpy2 0 gmt(2) 0 0;
                   dpy3 dvy3 gmt(3) 0 0;
                   y_segs ];
   prior_x_segs = x_segs;
   prior_y_segs = y_segs;
else
   % subsequent reps will adjust from the prior dt to the new dt
   prior_exit_angle = mod(round((atan2(prior_vy, prior_vx)-
3*pi/4)/(pi/2))*90,360);
   ea_advance_segs = mod((entry_angle_bp -
prior_exit_angle)/90,4);
      if (ea_advance_segs < 2)
         ea_advance_segs = ea_advance_segs + 4;
      end
   % If more than 2 segs are required, do them at the min
```

APPENDIX A-continued

```
possible time for maximum speed advantage.
  tmin_transition = 1e-4;          % 0.1msec
  if (tmin_transition < pi*velocity/(1000*9.8e6))
    tmin_transition = pi*velocity/(1000*9.8e6);     % limit
1000G
  end
  % insert extra segments if more than 1/2 of a rev is required
  tmin_transition = 1e-4;          % 0.1msec
  if (tmin_transition < pi*velocity/(1000*9.8e6))
    tmin_transition = pi*velocity/(1000*9.8e6);     % limit
1000G
  end
  for i=1:ea_advance_segs-2
    if ( prior_total_dt_y > prior_total_dt_x )
      dt = tmin_transition;
      if (dt <= prior_total_dt_y - prior_total_dt_x +
tmin_transition/2)
        dt = prior_total_dt_y - prior_total_dt_x +
tmin_transition/2;
      end
      prior_x_segs = [prior_x_segs; 0 -2*prior_vx dt 0 0];
      prior_vx = -prior_vx;
      prior_total_dt_x = prior_total_dt_x + dt;
    else
      dt = tmin_transition;
      if (dt <= prior_total_dt_x - prior_total_dt_y +
tmin_transition/2)
        dt = prior_total_dt_x - prior_total_dt_y +
tmin_transition/2;
      end
      prior_y_segs = [prior_y_segs; 0 -2*prior_vy dt 0 0];
      prior_vy = -prior_vy;
      prior_total_dt_y = prior_total_dt_y + dt;
    end
  end
  % now fix things up !
  if (prior_total_dt_y > prior_total_dt_x)
    dt = prior_total_dt_y - prior_total_dt_x - y_ref_time;
    prior_x_segs = [prior_x_segs; 0 -2*prior_vx dt 0 0];
  else
    dt = prior_total_dt_x - prior_total_dt_y - x_ref_time;
    prior_y_segs = [prior_y_segs; 0 -2*prior_vy dt 0 0];
  end
  % conglomerate things!
  prior_x_segs = [prior_x_segs; x_segs;]
  prior_y_segs = [prior_y_segs; y_segs;]
end
prior_total_dt_x = x_total_at;       % don't accumulate
prior_total_dt_y = y_total_dt;
prior_vx = vx;
prior_vy = vy;
% compute the entry angle for the next rev switch entry_angle,
case 0,
  switch init_entry_angle,
    case 0,
      new_ea = 180;
    case 90,
      new_ea = 90;
    case 180,
      new_ea = 270;
    case 270,
      new_ea = 180;
  end
case 90,
  switch init_entry_angle,
    case 0,
      new_ea = 270;
    case 90,
      new_ea = 270;
    case 180,
      new_ea = 180;
    case 270,
      new_ea = 0;
  end
case 180,
  switch init_entry_angle,
    case 0,
      new_ea = 90;
    case 90,
```

APPENDIX A-continued

```
            new_ea = 0;
        case 180,
            new_ea = 0;
        case 270,
            new_ea = 270;
        end
    case 270,
        switch init_entry_angle,
        case 0,
            new_ea = 0;
        case 90,
            new_ea = 180;
        case 180,
            new_ea = 90;
        case 270,
            new_ea = 90;
        end
    end
    entry_angle = new_ea;
end
x_segs = prior_x_segs;     % get the conglomerate
y_segs = prior_y_segs;
% Finish up the last rep, just coast to even up the dt
if (y_total _dt > x_total_dt)
    fixup = y_total_dt - x_total_dt;
    x_segs = [x_segs; vx*fixup 0 fixup 0 0];
else
    fixup = x_total_dt - y_total_dt;
    y_segs = [y_segs; vy*fixup 0 fixup 0 0];
end
```

APPENDIX B

```
% --- Executes incremental bite size upon button press in
eq_pulse_overlap.
function eq_pulse_overlap_Callback(hObject, eventdata, handles)
% hObject handle to eq_pulse_overlap
% eventdata reserved —to be defined in a future version of MATLAB
% handles structure with handles and user data
hole_diameter = str2double(get(handles.hole_diameter, 'String'));
eff_spot_size = str2double(get(handles.eff_spot_size, 'String'));
% Convert to velocity to number in um/sec
velocity = str2double(get(handles.velocity, 'String'))*1000;
revs = ceil(str2double(get(handles.revs_at_diam, 'String')));
prf_period = 1/(str2double(get(handles.prf, 'String'))*1000); % to sec
% Want to set incremental bite size to bite size / ceil(revs_at_diam)
Trev = pi*(hole_diameter-eff_spot_size)/velocity;
x = Trev/prf_period;
% Adjust
x = ceil(x+1/revs) - 1/revs;
% back out the new velocity
Trev = x*prf_period;
velocity = pi*(hole_diameter-eff_spot_size)/Trev;
set(handles.velocity, 'String', num2str(velocity/1000)); % to mm/sec
% Print the bite size, microns. Also the "incremental" bite size, which is
the advance of the first pulse of the 2nd revolution relative to the 1st
revolution set(handles.bite_size, 'String', num2str(velocity*prf_period));
imag_bite_size =
mod(prf_period-mod(Trev,prf_period),prf_period)*velocity;
set(handles.imag_bite_size, 'String', num2str(imag_bite_size));
```

It will be obvious to those having skill in the art that many changes may be made to the details of the above-described embodiments without departing from the underlying principles of the invention. The scope of the present invention should, therefore, be determined only by the following claims.

We claim:

1. A method of effecting high speed removal of material from a target region of a specimen by operation of a laser tool, the target region having a substantially circular target perimeter defined by a target diameter extending through a target center, and the laser tool defining a beam axis along which a laser beam propagates, the laser beam defining at the target region a laser spot having a diameter that is smaller than the target diameter, comprising:

causing relative movement between the beam axis and the target region to direct the beam axis to selected locations in the target region or selected locations near and in the target region to enable a process of material removal from the target region;

directing the beam axis at an entry segment acceleration and along an entry trajectory to an entry position within the target region, the entry position corresponding to a location where emission of the laser beam is initiated on the target region;

moving the beam axis at a circular perimeter acceleration within the target region to position the laser spot and thereby remove material along a circular segment of the target perimeter; and setting the entry segment acceleration and circular perimeter acceleration to values such that the entry segment acceleration value is less than twice the circular perimeter acceleration value.

2. The method of claim 1, in which the entry position is such that the beam spot is located on the circular segment of the target perimeter, and in which the beam axis exits the target region from a location proximal to the circular segment of the target perimeter.

3. The method of claim 1, in which the entry position is located in general proximity to the target center and the laser spot removes material along a curvilinear path progressively away from the target center to the circular segment of the target perimeter.

4. The method of claim 3, in which the entry position constitutes a first entry position and the curvilinear path constitutes a first curvilinear path, and further comprising:

directing the beam axis to a second entry position in general proximity to the target center; and directing the laser spot to remove material along a second curvilinear path progressively away from the target center to the target perimeter.

5. The method of claim 1, in which:
the circular segment includes the target perimeter in its entirety and the entry position is such that the laser spot is located on the target perimeter; and
the laser spot removes material in multiple revolutions about the target perimeter and thereafter removes material along a generally spiral path toward the target center.

6. The method of claim 5, in which the specimen includes any of a rigid or flexible printed wiring board material, a copper-clad or exposed printed wiring board material, a fiber reinforced or homogeneous resin dielectric printed wiring board material, a ceramic substrate, and a silicon substrate, and in which the removal of material from the target region of the specimen includes processing a hole.

7. The method of claim 1, in which:
the entry position is such that the laser spot is located on the circular segment of the target perimeter; and
the laser spot removes material along a first generally spiral path toward the target center, removes material along a second generally spiral path away from the target center, and returns to the circular segment of the target perimeter.

8. The method of claim 7, in which the entry position constitutes a first entry position, and further comprising:
directing the beam axis to a second entry position in the target region, the first and second entry positions being offset from each other;
directing the laser spot to remove material along a third generally spiral path toward the target center, remove material along a fourth generally spiral path away from the target center, and return to the target perimeter; and
directing the beam axis to exit the target region.

9. The method of claim 1, in which the specimen includes etched-circuit board material and the removal of material from the target region of the specimen includes processing a hole in the etched-circuit board material.

10. A method of effecting removal of material from a target region of a specimen by operation of a laser tool, the target region having a substantially circular target perimeter defined by a target diameter extending through a target center, and the laser tool defining a beam axis along which a laser beam propagates, the laser beam defining at the target region a laser spot having a diameter that is smaller than the target diameter, comprising:
causing relative movement between the beam axis and the target region to direct the beam axis to selected locations in the target region or selected locations near and in the target region to enable a process of material removal from the target region;
directing the beam axis along an entry trajectory to an entry position located on the target perimeter, the entry position corresponding to a location where emission of the laser beam is initiated on the target region; and
moving the beam axis within the target region to position the laser spot on the target perimeter to remove material in multiple revolutions about the target perimeter and thereafter remove material along a continuous generally spiral path toward the target center.

11. The method of claim 10, in which the specimen includes any of a rigid or flexible printed wiring board material, a copper-clad or exposed printed wiring board material, a fiber reinforced or homogeneous resin dielectric printed wiring board material, a ceramic substrate, and a silicon substrate, and in which the removal of material from the target region of the specimen includes processing a via hole in the specimen.

12. The method of claim 11, in which the via hole includes a blind via hole.

13. A method of effecting removal of material from a target region of a specimen by operation of a laser tool, the target region having a substantially circular target perimeter defined by a target diameter extending through a target center, and the laser tool defining a beam axis along which a laser beam propagates, the laser beam defining at the target region a laser spot having a diameter that is smaller than the target diameter, comprising:
causing relative movement between the beam axis and the target region to direct the beam axis to selected locations in the target region or selected locations near and in the target region to enable a process of material removal from the target region;
directing the beam axis along an entry trajectory to an entry position located on the target perimeter, the entry position corresponding to a location where emission of the laser beam is initiated on the target region; and
moving the beam axis within the target region to position the laser spot to remove material along a first continuous generally spiral path toward the target center remove material along a second continuous generally spiral path away from the target center, and return to the circular segment of the target perimeter.

14. The method of claim 13, in which the entry position constitutes a first entry position, and further comprising:
directing the beam axis to a second entry position in the target region, the first and second entry positions being offset from each other;
directing the laser spot to remove material along a third continuous generally spiral path toward the target center, remove material along a fourth continuous generally spiral path away from the target center, and return to the target perimeter; and
directing the beam axis to exit the target region.

15. A method of using a beam of pulsed laser emissions at a pulse repetition rate to remove material from a target region of a specimen, the target region having a target perimeter defined by a target diameter and each pulsed laser emission of the beam defining at the target region a laser spot having a diameter that is smaller than the target diameter, comprising:
moving the beam of pulsed laser emissions and target region relative to each other at a tool velocity multiple times around the target perimeter to cause the beam of pulsed laser emissions to remove material in multiple repetitions of a tool pattern, each laser spot being incident on a location of the target region during each of the multiple repetitions of the tool pattern; and
controlling the tool velocity and the pulse repetition rate to substantially uniformly spread laser emission energy around the target perimeter by positioning the locations of the laser spots for a repetition of the tool pattern so that the laser spots are not coincident with locations on which the laser spots of a previous repetition were incident.

16. A method of using a beam of pulsed laser emissions at a pulse repetition rate to move material from a target region of a specimen, the target region having a substantially circular target perimeter defined by a target diameter and each pulsed laser emission of the beam defining at the target region a laser spot having a diameter that is smaller than the target diameter, comprising:

moving the beam of pulsed laser emissions and target region relative to each other at a tool velocity multiple times around the circular target perimeter to cause the beam of pulsed laser emissions to remove material in multiple repetitions of a tool pattern, each laser spot being incident on a location of the target region during each of the multiple repetitions of the tool pattern; and controlling the tool velocity and the pulse repetition rate to substantially uniformly spread laser emission energy around the circular target perimeter by positioning the locations of the laser spots for a repetition of the tool pattern so that the laser spots are not coincident with locations on which the laser spots of a previous repetition were incident.

17. The method of claim 16, in which the controlling includes adjusting at least one of the tool velocity, the pulse repetition rate, the laser spot diameter, and the target diameter.

18. The method of claim 16, in which the positioning of the locations of the laser spots includes determining a distance by which the locations of the laser spots are to be positioned, and in which the distance has a tolerance of 20 percent or less.

19. The method of claim 16, in which the positioning of the locations of the laser spots includes determining a distance by which the locations of the laser spots are to be positioned, and in which the distance is at least about 1.0 micrometer.

20. A method of using a beam of pulsed laser emissions at a pulse repetition rate to remove material from a target region of a specimen, the target region having a target perimeter defined by a target diameter and each pulsed laser emission of the beam defining at the target region a laser spot having a diameter that is smaller than the target diameter, comprising:

moving the beam of pulsed laser emissions and target region relative to each other at a tool velocity multiple times around the circular target perimeter to cause the beam of pulsed laser emissions to remove material in multiple repetitions of a tool pattern, each laser spot being incident on a location of the target region during each of the multiple repetitions of the tool pattern; and controlling the tool velocity and the pulse repetition rate to spread laser emission energy around the circular target perimeter by positioning the locations of the laser spots for a repetition of the tool pattern so that the laser spots are not coincident with locations on which the laser spots of a previous repetition were incident, the positioning of the locations of the laser spots including determining from the following expression a distance, Δrep, by which the locations of the laser spots shift:

$$\Delta_{rep} = \frac{v}{(PRF)(Cycles)},$$

where
v=the tool velocity;
PRE=the pulse repetition rate; and
Cycles=the number of repetitions of the tool pattern.

21. A method of using a beam of pulsed laser emissions at a pulse repetition rate to remove material from a target region of a specimen, the target region having a target perimeter defined by a target diameter and each pulsed laser emission of the beam defining at the target region a laser spot having a diameter that is smaller than the target diameter, comprising:

moving the beam of pulsed laser emissions and target region relative to each other at a tool velocity multiple times around the circular target perimeter to cause the beam of pulsed laser emissions to remove material in multiple repetitions of a tool pattern, each laser spot being incident on a location of the target region during each of the multiple repetitions of the tool pattern; and controlling the tool velocity and the pulse repetition rate to spread laser emission energy around the circular target perimeter by positioning the locations of the laser spots for a repetition of the tool pattern so that the laser spots are not coincident with locations on which the laser spots of a previous repetition were incident, the positioning of the locations of the laser spots including determining the tool velocity v from the following expression:

$$v = \frac{\pi(D_{\mathit{eff}})(PRF)}{x},$$

where
$D_{\mathit{eff}}$=the target diameter;
PRF=the pulse repetition rate; and
x=any positive number with a fractional remainder of $$1 - \frac{1}{Cycles},$$

where Cycles=a number of repetitions of the tool pattern.

22. A method of using a beam of pulsed laser emissions at a pulse repetition rate to remove material from a target region of a specimen, the target region having a target perimeter defined by a target diameter and each pulsed laser emission of the beam defining at the target region a laser spot having a diameter that is smaller than the target diameter, comprising:

moving the beam of pulsed laser emissions and target region relative to each other at a tool velocity multiple times around the circular target perimeter to cause the beam of pulsed laser emissions to remove material in multiple repetitions of a tool pattern, each laser spot being incident on a location of the target region during each of the multiple repetitions of the tool pattern; and controlling the tool velocity and the pulse repetition rate to spread laser emission energy around the circular target perimeter by positioning the locations of the laser spots for a repetition of the tool pattern so that the laser spots are not coincident with locations on which the laser spots of a previous repetition were incident, the positioning of the locations of the laser spots including determining the pulse repetition rate PRF from the following expression:

$$PRF = \frac{vx}{\pi(D_{\mathit{eff}})},$$

where
$D_{\mathit{eff}}$=the target diameter;
v=the tool velocity; and
x=any positive number with a fractional remainder of $$1 - \frac{1}{Cycles},$$

where Cycles=a number of repetitions of the tool pattern.

23. A method of using a beam of pulsed laser emissions at a pulse repetition rate to remove material from a target region of a specimen, the target region having a target perimeter defined by a target diameter and each pulsed laser emission of the beam defining at the target region a laser spot having a diameter that is smaller than the target diameter, comprising:

moving the beam of pulsed laser emissions and target region relative to each other at a tool velocity multiple times around the circular target perimeter to cause the beam of pulsed laser emissions to remove material in multiple repetitions of a tool pattern, each laser spot being incident on a location of the target region during each of the multiple repetitions of the tool pattern; and controlling the tool velocity and the pulse repetition rate to spread laser emission energy around the circular target perimeter by positioning the locations of the laser spots for a repetition of the tool pattern so that the laser spots are not coincident with locations on which the laser spots of a previous repetition were incident, the positioning of the locations of the laser spots including determining the target diameter $D_{eff}$ from the following expression:

$$D_{eff} = \frac{vx}{\pi(PRF)},$$

where
v = the tool velocity;
PRF = the pulse repetition rate; and
x = any positive number with a fractional remainder of $$1 - \frac{1}{Cycles},$$

where Cycles = a number of repetitions of the tool pattern.

24. A method for coordinating emission of laser pulses for incidence on predetermined laser beam positioning command locations of a target specimen, comprising:

providing a beam positioning command to start a beam positioner move segment relative to the target specimen, the beam positioner move segment including a beam positioning command location;

causing emission of a set of laser pulses in response to a laser gate signal, the set including a first laser pulse; and introducing a fractional laser beam delay that includes multiple delay time components between the start of the beam positioner move segment and emission of the first laser pulse so that it is incident on the beam positioning command location during the beam positioner move segment, the laser gate signal and multiple delay time components being in time relationship such that the laser gate signal occurs before expiration of all of the multiple delay time components.

25. The method of claim 24, in which the introducing of a fractional laser beam delay results in delay of the beam positioning command relative to the laser gate signal by an amount that causes incidence of the first laser pulse on the beam positioning command location.

26. The method of claim 24, in which the delay time components include a first pulse delay component, and in which the emission of a set of laser pulses takes place after expiration of the first pulse delay component the first pulse delay component being of sufficient duration to prevent emission of an abnormally low energy laser pulse as the first laser pulse.

27. The method of claim 24, in which the laser gate signal occurs in response to the beam positioning command after expiration of a positioner delay resulting from filter and beam positioner delay time components.

* * * * *